United States Patent [19]
Dhong et al.

[11] Patent Number: 5,339,274
[45] Date of Patent: Aug. 16, 1994

[54] VARIABLE BITLINE PRECHARGE VOLTAGE SENSING TECHNIQUE FOR DRAM STRUCTURES

[75] Inventors: Sang H. Dhong, Mahopac, N.Y.; Toshiaki Kirihata, South Burlington, Vt.; Hyun J. Shin, Mahopac, N.Y.; Toshio Sunaga, Kusatsu; Yoichi Taira, Setagaya, both of Japan; Lewis M. Terman, South Salem, N.Y.

[73] Assignee: International Business Machines Corporation, Armonk, N.Y.

[21] Appl. No.: 969,644

[22] Filed: Oct. 30, 1992

[51] Int. Cl.⁵ .................................. G11C 7/00
[52] U.S. Cl. ............................. 365/203; 365/210
[58] Field of Search ........... 365/203, 210, 207, 222, 365/149

[56] References Cited

U.S. PATENT DOCUMENTS

| | | | |
|---|---|---|---|
| 4,669,065 | 5/1987 | Ohsawa | 365/210 |
| 4,774,691 | 9/1988 | Hidaka | 365/203 |
| 4,792,928 | 12/1988 | Tobita | 365/210 |
| 4,794,571 | 12/1988 | Uchida | 365/205 |
| 4,816,706 | 3/1989 | Dhong et al. | 307/530 |
| 4,833,654 | 5/1989 | Suwa et al. | 365/210 |
| 4,852,064 | 7/1989 | Kim et al. | 365/203 |
| 4,916,667 | 4/1990 | Miyabayashi et al. | 365/207 |
| 4,926,381 | 5/1990 | Fujii | 365/189.01 |
| 4,943,952 | 7/1990 | Terayama | 365/207 |
| 4,943,960 | 7/1990 | Komatsu et al. | 365/222 |
| 4,998,222 | 3/1991 | Sussman | 365/203 |
| 5,036,492 | 7/1991 | Runaldue | 365/203 |
| 5,184,326 | 2/1993 | Hoffman | 365/203 |

OTHER PUBLICATIONS

D. W. Plass, "Data Bus Sense AMP With Switched Isolators", IBM Technical Disclosure Bulletin, vol. 27, No. 2, Jul. 1984.

*Primary Examiner*—Eugene R. LaRoche
*Assistant Examiner*—A. Zarabian
*Attorney, Agent, or Firm*—Philip J. Feig; David Aker

[57] ABSTRACT

A sensing technique uses a variable precharge voltage sensing with a single bitline swing in a DRAM cell or array of DRAM cells so that the power dissipation is reduced. The bitline precharge voltage varies from one RAS cycle to the next RAS cycle depending upon the level of the data in the accessed cells. Such an arrangement eliminates the need for a reference voltage generator since the precharge voltage is not the same voltage for each RAS cycle.

18 Claims, 6 Drawing Sheets

VARIABLE BITLINE PRECHARGE VOLTAGE SENSING TECHNIQUE FOR DRAM STRUCTURES

BACKGROUND OF THE INVENTION

1. Field of the Invention

The present invention relates to dynamic random access memory (DRAM) structures and more particularly to a sensing method for DRAM structures using a single-bitline voltage swing and variable bitline precharge voltage.

2. Description of the Background Art

U.S. Pat. No. 4,669,065 issued May 26, 1987 to Ohsawa and entitled, "DYNAMIC MEMORY APPARATUS HAVING A SENSE AMPLIFIER AND A REFERENCE VOLTAGE CONNECTION CIRCUIT THEREFOR" discloses a memory apparatus that has a dummy cell comprising two sets of series connections of MOS transistors and capacitors, respectively, connected to a pair of bitlines, which are connected to a sense amplifier of a flip-flop type, and a third MOS transistor having a source and a drain thereof connected between junction points of the MOS transistors and the capacitors of the dummy cell. The capacitors are charged at a high level potential and a low level potential, respectively, of the bitlines and then they are shorted to each other through the third MOS transistor so that they have a common potential of a middle potential level. The potential of the middle level can be supplied to a pair of input terminals to the flip-flop type sense amplifier as a reference potential signal. Thus, it is possible to assure a stable sensing operation by the sense amplifier which is free from an influence of a change in the potential of a substrate of the memory apparatus.

U.S. Pat. No. 4,792,928 issued Dec. 20, 1988 to Tobita entitled, "SEMICONDUCTOR MEMORY CIRCUIT WITH CONTROL OF BITLINE VOLTAGE BALANCING" describes a semiconductor memory circuit that includes a plurality of memory cell columns each comprising a plurality of memory cells connected to a bitline, at least a dummy cell connected to a bitline constituting a bitline pair with said bitline, a sense amplifier connected between said two bitlines, and at least a FET for balancing the voltages of said two bitlines; and a balance control circuit for detecting the termination of selection of a dummy word line which is provided for the control of the dummy cell and thereafter operating the FET.

U.S. Pat. No. 4,816,706 issued Mar. 28, 1989 to Dhong et al entitled, "SENSE AMPLIFIER WITH IMPROVED BITLINE PRECHARGING FOR DYNAMIC RANDOM ACCESS MEMORY" discloses a sense amplifier and decoupling device structure for integrated circuit memories wherein an embodiment of a cross-coupled sense amplifier includes two PMOS devices, the gates of which devices are grounded and clamp the downward voltage swing of the memory bitlines to the absolute value of the threshold voltage (VTP) of the grounded-gate PMOS devices in the sense amplifier. This limited voltage swing does not affect charge storage of storage capacitors because the absolute value of the threshold voltage (VT) of the cell transfer gate device is larger. Precharging the bitlines is achieved by equalizing the two bitlines, each initially charged to VDD and |VTP|, respectively. One node of the sense amplifier retains a full VDD swing and is conveniently connected to the DATA bus. The sense amplifier bitline swing is limited to a swing of VDD−|VTP| and saves power without adversely affecting charge storage and the precharging level.

U.S. Pat. No. 4,669,065 issued May 26, 1987 to Ohsawa and entitled, "DYNAMIC MEMORY APPARATUS HAVING A SENSE AMPLIFIER AND A REFERENCE VOLTAGE CONNECTION CIRCUIT THEREFOR" discloses a method of making a dummy cell of a CMOS DRAM.

U.S. Pat. No. 4,816,706 issued Mar. 28, 1989 to Dhong et al entitled, "SENSE AMPLIFIER WITH IMPROVED BITLINE PRECHARGING FOR DYNAMIC RANDOM ACCESS MEMORY" discloses 2/3 VDD sensing with the limited bitline swing.

U.S. Pat. No. 4,792,928 issued Dec. 20, 1988 to Tobita and entitled, "SEMICONDUCTOR MEMORY CIRCUIT WITH CONTROL OF BIT LINE VOLTAGE BALANCING" discloses a method for precharging the bitlines at the end of a RAS cycle. The reference wordline with the dummy cells is monitored for initiating the precharging of the bitlines.

U.S. Pat. No. 5,036,492 issued Jul. 30, 1991 to Runaldue and entitled, "CMOS PRECHARGE AND EQUALIZATION CIRCUIT" discloses a precharging circuit for SRAM where the equalization and precharging of the bitlines are done without current bleeding devices.

U.S. Pat. No. 4,998,222 issued Mar. 5, 1991 to Sussman and entitled, "DYNAMIC RANDOM ACCESS MEMORY WITH INTERNALLY GATED RAS" discloses a bitline precharging circuit which is controlled by an internally RAS gated clock.

U.S. Pat. No. 4,943,960 issued Jul. 24, 1990 to Komatsu et al and entitled, "SELF-REFRESHING OF DYNAMIC RANDOM ACCESS MEMORY DEVICE AND OPERATING METHOD THEREFOR" discloses a detection circuit which detects the self-refresh mode and a voltage generator which precharges the bitlines.

U.S. Pat. No. 4,943,952 issued Jul. 24, 1990 to Terayama and entitled, "SEMICONDUCTOR MEMORY CIRCUIT WITH IMPROVED BIT LANE PRECHARGE CIRCUIT" discloses a bitline precharge circuit which is based on the concept of capacitive charge sharing.

U.S. Pat. No. 4,926,381 issued May 15, 1990 to Fujii entitled, "SEMICONDUCTOR MEMORY CIRCUIT WITH SENSING ARRANGEMENT FREE FROM MALFUNCTION" discloses a sensing method where the sense amplifier is totally isolated from the bitline by an isolator during sensing.

U.S. Pat. No. 4,916,667 issued Apr. 10, 1990 to Miyabayashi et al entitled, "DYNAMIC RANDOM ACCESS MEMORY HAVING FOLDED BIT LINE-SHARED SENSE AMPLIFIERS" discloses a sensing method where the sense amplifiers are shared by the two memory array.

U.S. Pat. No. 4,852,064 issued Jul. 25, 1989 to Kim et al and entitled, "PRECHARGE CIRCUIT FOR USE IN A SEMICONDUCTOR MEMORY DEVICE" discloses a precharging circuit for SRAM where the precharging is done in two stages.

U.S. Pat. No. 4,833,654 issued May 23, 1989 to Suwa et al entitled, "METHOD OF AND CIRCUITRY FOR GENERATING STAGGERED RESTORE TIMING SIGNALS IN BLOCK PARTITIONED DRAM" discloses a method for generating staggered restore timing signals in block partitioned DRAM.

U.S. Pat. No. 4,794,571 issued Dec. 27, 1988 to Uchida and entitled, "DYNAMIC READ-WRITE RANDOM ACCESS MEMORY" discloses a DRAM with reduced leakage by biasing the bitlines to a voltage between that of the wordlines and the voltage of the drain of the MOS transistor.

SUMMARY OF THE INVENTION

An object of the present invention is to provide a sensing means for a DRAM which has a low bitline power dissipation.

Another object of the present invention is to provide a sensing method employing a variable precharge voltage with a single-bitline voltage swing.

A further object of the present invention is to provide a sensing means for a DRAM wherein the bitline precharge voltage changes from one RAS cycle to the next.

Further and still other objects of the present invention will become more clearly apparent when the following description is read in conjunction with the accompanying drawings.

DESCRIPTION OF THE PREFERRED EMBODIMENT

State-of-the-art increases in DRAM circuit density has produced an interest in very large sold-state memory systems with battery back-up for non-volatility. Reducing DRAM power consumption during refresh cycles is of utmost concern for these applications, especially for the period when the DRAM is powered by a battery. In conventional DRAMs, a cell is refreshed by first reading out the state of the cell into the sense amplifier, setting the sense amplifier and then writing the state back into the cell. Using, for example $V_{DD}/2$ sensing, both bit lines in a bitline pair are precharged to $V_{DD}/2$, and when the cell is sensed and rewritten, one bitline of the pair undergoes a voltage swing to ground, and the other undergoes a swing to $V_{DD}$. The bitlines are then restored back to $V_{DD}/2$ during precharge. In this sequence, both bitlines dissipate a.c. energy, thus, refresh of a DRAM memory cell of the type wherein both bitlines undergo voltage swings results in energy dissipation on both bitlines.

Another version of a memory circuit DRAM provides a single-bitline swing sensing scheme where the refresh energy is reduced by holding the reference bitline of a bitline pair at the bitline precharge voltage during sense amplifier latching and subsequent rewrite into one cell. Sensing/rewrite and writing operations of the cell are not affected, since the reference bitline does not need to undergo a voltage swing for the sensing/rewrite and write operations. Thus, the a.c. energy dissipated by the voltage swing on the reference bitline in conventional refresh, read and write operations is eliminated. A single-bitline swing DRAM memory circuit is described in co-pending patent application Ser. No. 07/729,120 filed Jul. 12, 1991 by S. H. Dhong et al., entitled "POWER SAVING SENSING CIRCUITS FOR DYNAMIC RANDOM ACCESS MEMORY" and which is assigned to the IBM Corporation.

The present invention provides a new sensing scheme, which uses a floating sensing voltage with single-bitline swing, the bitline power dissipation of which is only $\frac{2}{3}$ that of $\frac{1}{2} V_{DD}$ sensing for the worst-case pattern. In the new sensing scheme, the bitline precharge voltage changes from one row address storage (RAS) cycle to the next, depending on the precharge voltage of the previous RAS cycle and the polarity of the data in the accessed cells. Also, in the present invention there is no need for having a reference voltage generator because the precharge is not at a fixed potential.

Figure 1:
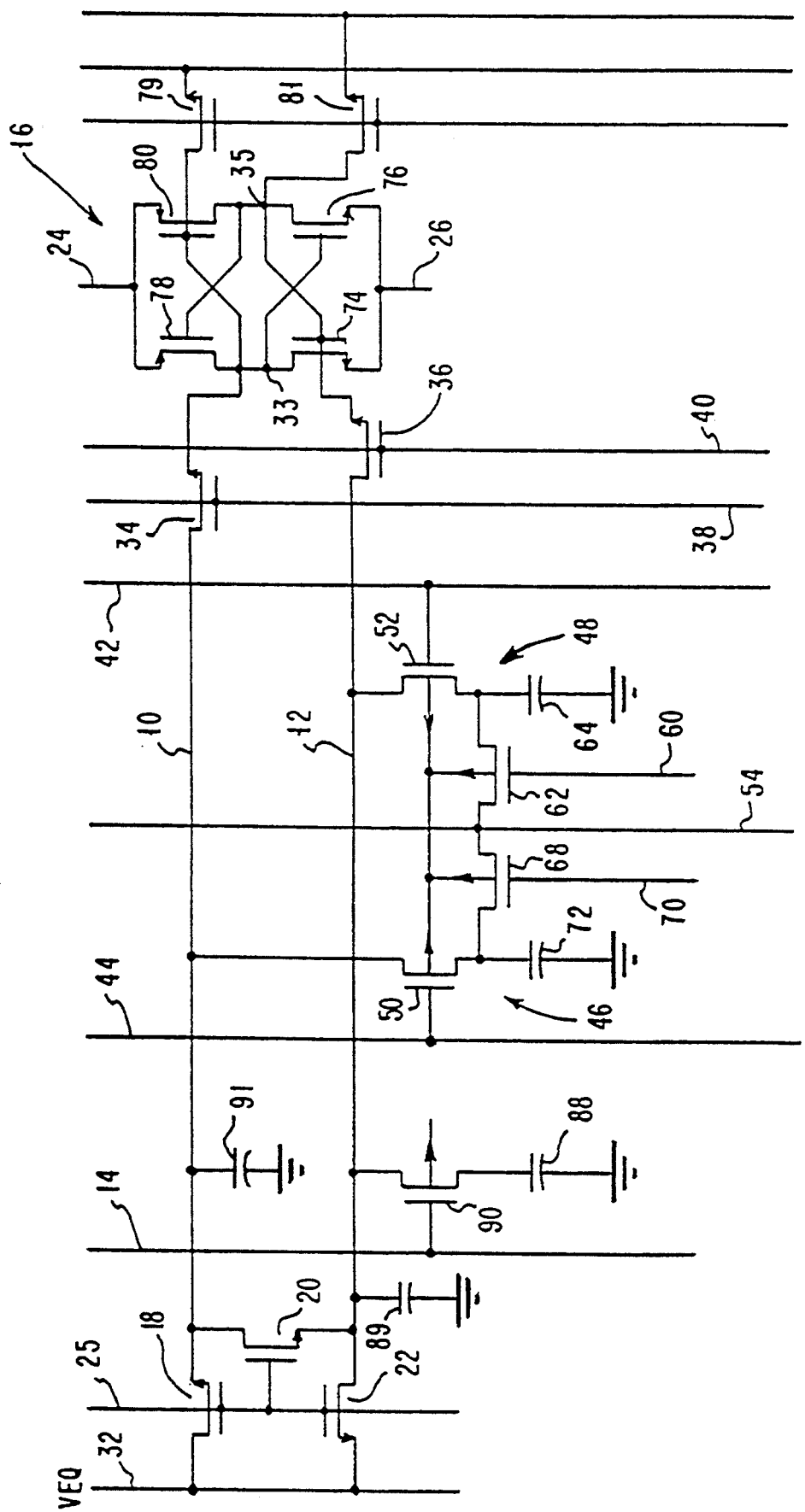
FIG. 1 is a schematic illustration of a circuit embodiment of a portion of a bitline pair according to the present invention.

The new sensing scheme is shown in simplified form in FIG. 1. In FIG. 1, the principles of the invention are illustrated in connection with only a single bitline pair. Similar to co-pending patent application Ser. No. 07/729,120 described above, the sensing/rewrite scheme involves the voltage on only the bitline connected to the accessed cell undergoing a swing to either the high voltage level stored in the cell, or to the low voltage level stored in the cell to accomplish re-writing of the stored information back into the cell; the complementary bitline in the bitline pair does not undergo such a voltage swing. Assume that a cell will have $V_{DD}$ stored in it for a "1", and a low voltage level at or near ground for a "0".

The basic concept is to let the bitline precharge voltage at the end of a cycle be determined by shorting together the active bitline (the bitline connected to the accessed cell) and the complementary bitline (which was connected to the reference cell). Thus, the bitline precharge voltage depends upon the sequence of data bits sensed previously on the bitline pair; it asymptotically approaches $V_{DD}$ for reading a series of high levels, and asymptotically approaches the cell low level for reading a series of low levels, or will move in between $V_{DD}$ and the low level for sequences that are a mix of "1" and "0" levels.

Since the reference voltage for sensing is determined by a reference cell which is initially precharged half way between the high and low levels which can be stored in the cell, the cell can be sensed for any precharge level. Assuming complete charge transfer between the bitline capacitance $C_{BL}$ and the cell storage capacitance $C_S$, the final voltage on a bitline after the cell is accessed, $V_F$, is given by $$V_F = V_S \frac{C_S}{C_S + C_{BL}} + V_{PRE} \frac{C_{BL}}{C_S + C_{BL}}$$

where
$C_S$ = cell storage capacitance
$C_{BL}$ = bitline capacitance
$V_S$ = the voltage stored on the cell capacitance $C_S$
$V_{PRE}$ = the voltage to which the bitline is precharged at the beginning at the sensing cycle.

If full supply levels ($V_{DD}$ and ground) are written into the cell then the voltage stored in the cell $V_S$ is $V_S = V_{DD}$ for a "1" stored $V_S = 0$ V for a "0" stored
For the reference cell $$V_S = \frac{V_{DD}}{2}$$

and the differential signal for sensing between the bitline connected to an accessed cell with a "1" or "0" stored and the bitline connected to an accessed reference cell containing $V_{DD}/2$ is $$\Delta V_{sense} = \pm \frac{V_{DD}}{2} \left( \frac{C_S}{C_S + C_{BL}} \right)$$

where the (+) is for $V_{DD}$ stored in the cell, and the (−) is for 0V stored in the cell. $\Delta V_{sense}$ is independent of the precharge voltage $V_{PRE}$.

Figure 4:
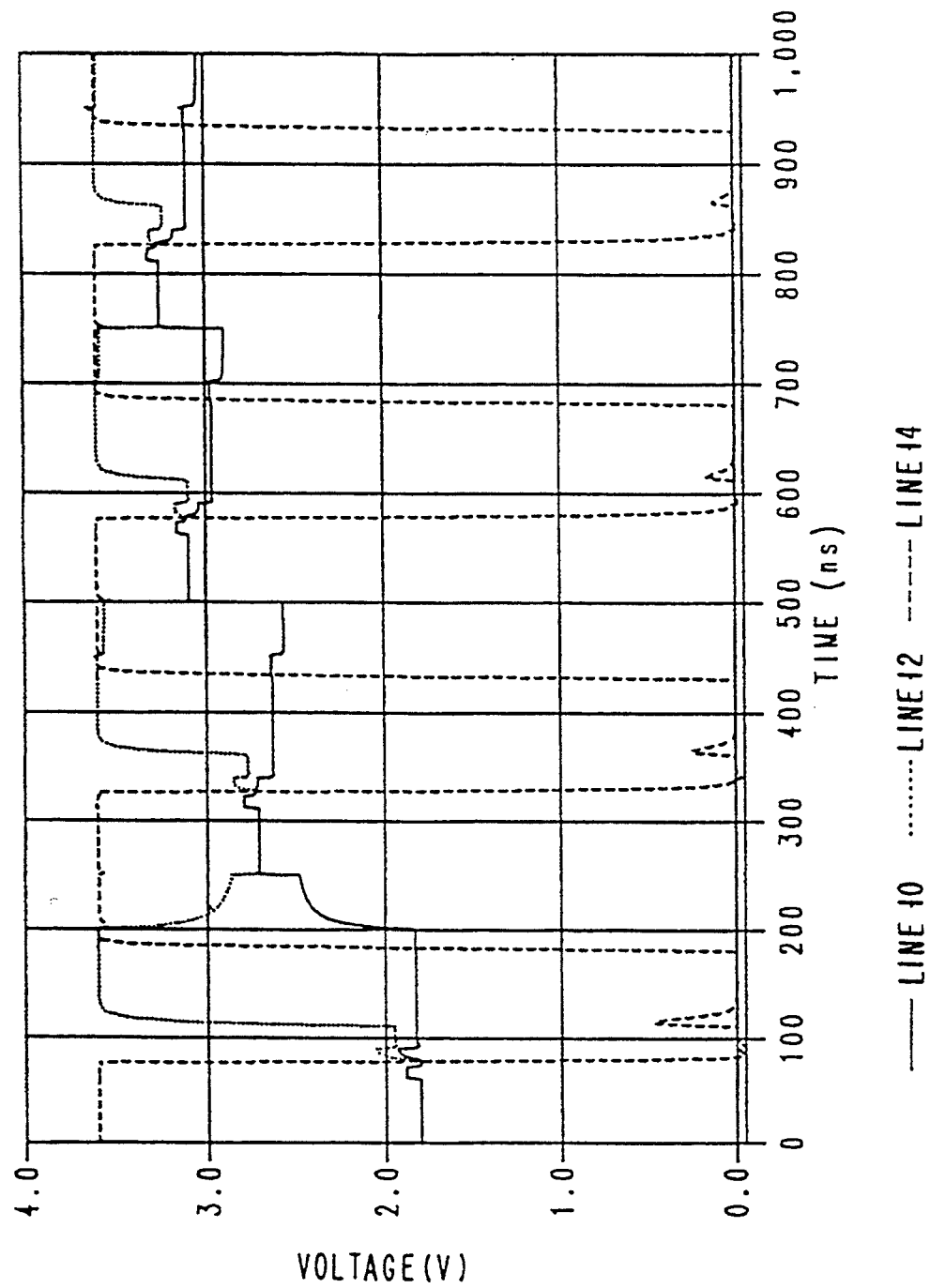
FIGS. 4 and 5 are illustrations of the voltage waveforms present on the bitlines of FIG. 1 during circuit operation.

The implementation of the new sensing scheme can be explained by following the example waveforms shown in FIG. 4. The bitlines 10, 12 are precharged to a given voltage at t=0. Assume this voltage is initially 1.8 V or ½ $V_{DD}$, where $V_{DD}$=3.6 V in FIG. 4. The reference cell capacitance 72 is charged to $V_{DD}/2$. The wordline 14 is activated and reference cell word line 44 is also activated.

Figure 3:
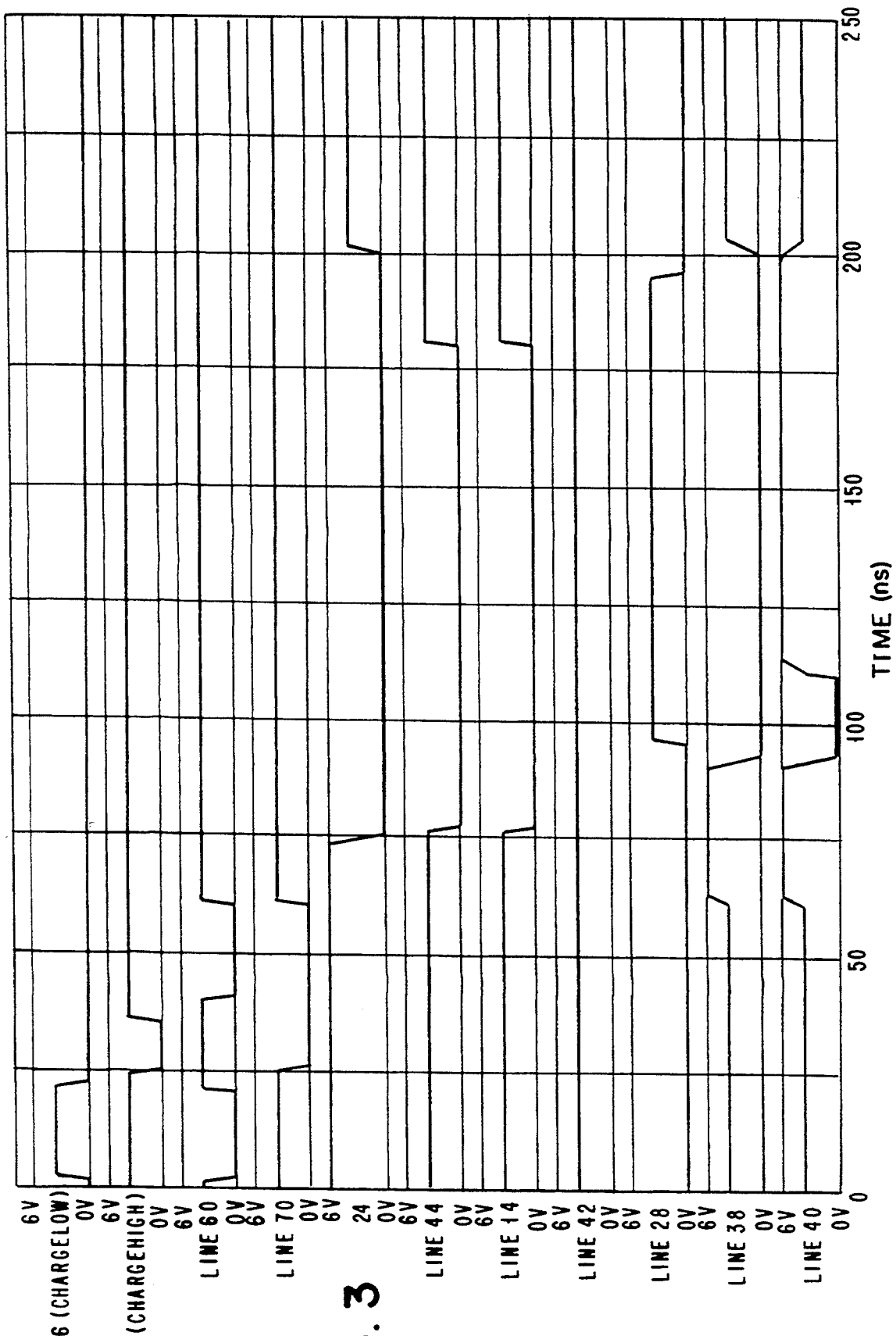
FIG. 3 is an illustration of the waveforms of the signals associated with the circuit embodiment of FIG. 1.

The activation of word line 14 causes charge transfer between the cell capacitance $C_S$ 88 and the bitline capacitance $C_{BL}$ 89. At the same time, the reference cell word line 44 is accessed, and charge is shared between the bitline capacitance $C_{BL}$ 91 and the reference cell capacitance 72. As a result, a differential signal between bitlines 10 and 12 is generated, as described above. This differential voltage is impressed on the nodes 33 and 35 of the sense amplifier 16 through devices 34 and 36. Devices 34 and 36 are then turned off, isolating the nodes of the sense amplifier 16, and the sense amplifier is set in the conventional manner by pulsing node 24 to $V_{DD}$, and node 26 to ground. Assuming the cell capacitance stored the voltage $V_{DD}$, the setting of the sense amplifier 16 results in node 35 going to $V_{DD}$, and node 33 going to ground. Then device 36 is turned back on by a pulse on line 40, causing the bitline 12 to go to $V_{DD}$, and rewriting $V_{DD}$ back into cell storage capacitance 88. Then, the word lines 14 and 44 are deselected, turning off devices 90 and 50, and sense amplifier pulse lines 24 and 26 return to their initial levels, completing the RAS cycle. The complementary bitline 10 is not connected to the sense amplifier after the sense amplifier has set, and remains close to the precharge voltage it had at the beginning at the cycle. Detailed waveforms of the signals on various lines are shown in FIG. 3.

At the end of a RAS cycle, the bitline 10 and its complement 12 are shorted together and to $V_{eq}$ via line 32 by devices 18, 20, and 22, and equilibrate at a voltage which becomes the bitline precharge voltage for the next RAS cycle. This precharge voltage is higher than the precharge voltage of the previous cycle. If the accessed memory cell capacitance 88 had had 0 volts stored on it, the bitline precharge voltage would be lower than that of the previous RAS cycle. If the accessed cell connected to bitline 14 on each subsequent cycle has a high level stored on its cell capacitance, for the following RAS cycles the same sequence is repeated and the bitline precharge voltages increases each cycle.

No bitline power is drawn from the DRAM power supply to equilibrate the bitline pair voltage to the precharge voltage; only redistribution of charge between the bitlines is involved. No bitline power is drawn from the supply voltage when the bitline goes from the precharge voltage to the low cell level (i.e. a "0" is sensed). Only when a high level or "1" is sensed does current flow from the power supply into the bitline. For an individual cycle, this power may be greater than for $V_{DD}/2$ sensing which also uses a single bitline swing, but over a series of cycles, the highest average power dissipation for the new variable precharged voltage sensing scheme occurs when a data pattern of alternating 0's (low levels) and 1's (high levels) (10101010 . . . ) is read out. In the case of an alternating 1 and 0 pattern, if a stored "1" is $V_{DD}$ and a stored "0" is 0 volts, the precharge voltage will asymptotically approach being at ⅔ $V_{DD}$ and ⅓ $V_{DD}$ on alternate cycles. In this case, the power dissipation is proportional to ⅓ $V_{DD}$. In the conventional $V_{DD}/2$ sensing design case, the power dissipation is proportional to ½ $V_{DD}$. The new method dissipates ⅔ of the power of that dissipated in the conventional $V_{DD}/2$ sensing case in the worst case. Conventional $V_{DD}/2$ sensing dissipates the minimum worst case bitline power of any fixed bitline precharge voltage approach, assuming a stored "1" is $V_{DD}$ and a stored "0" is 0 volts.

Figure 2:
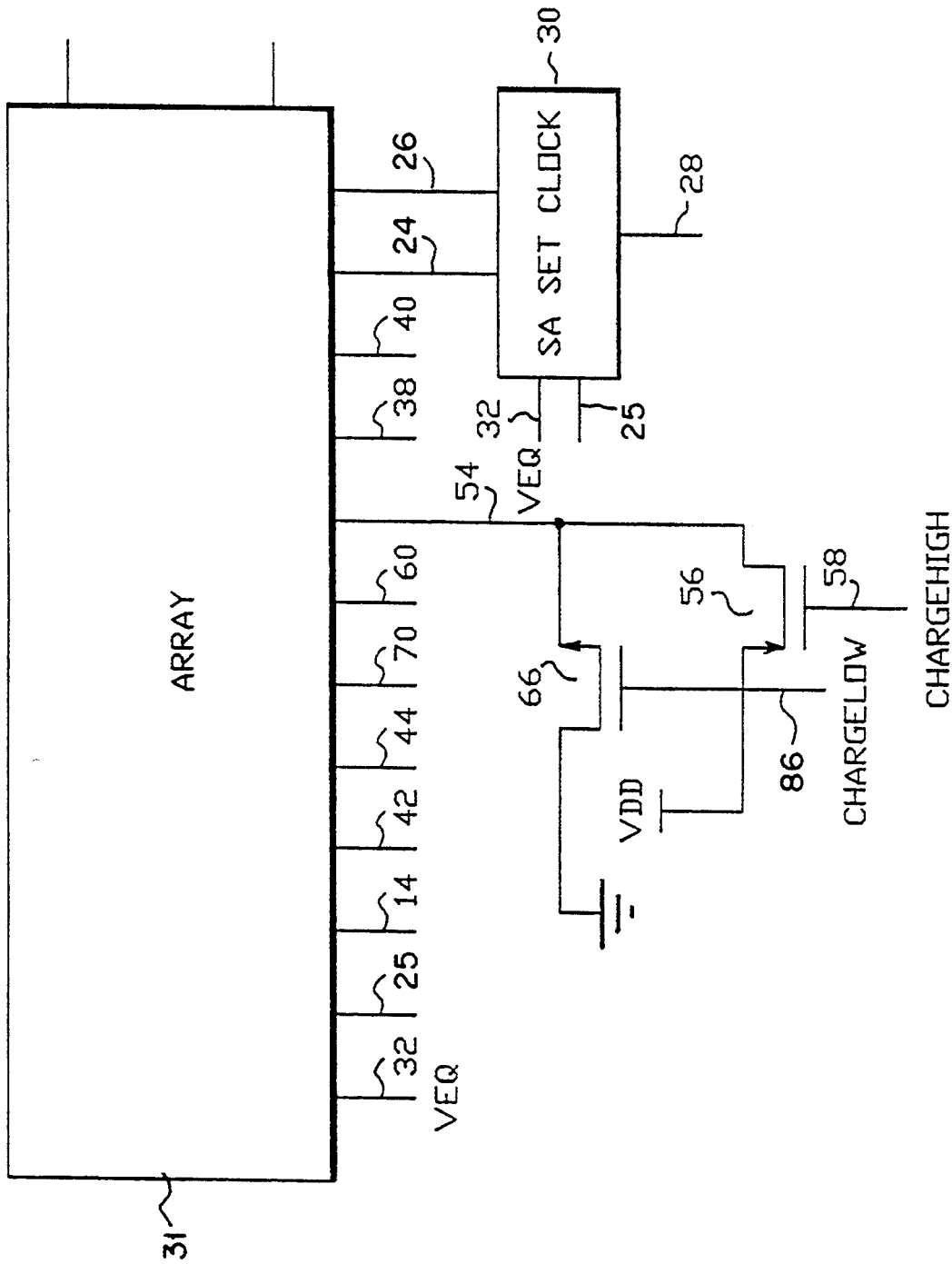
FIG. 2 is a schematic illustration of an embodiment of a memory array according to the present invention.

A preferred embodiment of a memory array according to the present invention is shown in FIG. 2, with corresponding waveforms being illustrated in FIGS. 3 to 6. The array 31 is a conventional two-dimension array of memory cells, with cells connected to word lines running in the x-direction, and cells connected to bitlines running in the Y-direction, and bitlines organized in pairs in a conventional folded bitline arrangement as is well known to those skilled in the art. The $V_{eq}$ line 32 is common to all bitline pairs in the array; as a result, the precharge voltage change averages the effect of all the data stored in all the accessed cells in the array, not just that of a single stored bit as is the case described in connection with the embodiment shown in FIG. 1. Since the precharge voltage varies from cycle to cycle, a reference cell must be provided for each bitline in order to sense the bitline signal differentially as shown in FIG. 1. The preferred level of the reference cell is the midway between the high and low voltage levels stored in a cell. This requirement is similar to conventional DRAMs, but the method of achieving the mid level in the reference cells is different because of the single-bitline swing and the fact that the bitline precharge voltage may be any level between the high and low levels stored in the cells.

Near the end of a RAS cycle the bitline pairs 10 and 12 shown in FIG. 1 are equalized to the precharge voltage $V_{eq}$ on line 32 by turning on equalizing devices, 18, 20 and 22. The signal on lead 25, which controls devices 18, 20 and 22, is high. All the bitline pairs in the array precharge to the same voltage through their respective equalizing devices which are connected to line 32. Each pair of bitlines must be coupled to an associated $V_{eq}$ through line 32. A plurality of bitline pairs may be coupled to the same line 32, requiring a line 32 to be associated with each plurality of bitline pairs. Preferably, all bitline pairs in the array are coupled to the same line 32. Leads 24 and 26 are at the same voltage as the precharge voltage, input lead 28 to SA set clock 30 is low as with conventional sensing, and leads 24 and 26 connect to the respective inputs at each sense amplifier for each bitline pair. Maintaining the same precharge voltage on all the bitline pairs in the array of FIG. 2 and also for leads 24 and 26 guarantees that all sense amplifiers 16 for each bitline pair are off at this stage of operation. The devices 34 and 36 are on with lines 38 and 40 high. All wordlines and reference wordlines are high, turning off all PMOS cell access transistors.

With the conditions described above, the mid level is restored to the reference cells as follows. Lead 54 is pulled to $V_{DD}$ by turning on the transistor 56 with the signal on the CHARGEHIGH lead 58 going low. The signal on lead 60 goes low and turns on device 62, charging the reference-cell storage capacitor 64 to $V_{DD}$. Lead 60 returns to high and turns off device 62; and lead 54 is pulled low by turning device 66 on and turning device 56 off. Turning on device 68 by lowering the signal on lead 70 charges the reference-cell storage capacitor 72 to the low level of the storage capacitor. Then, line 54 is floated by turning device 66 off, and capacitors 72 and 64 are equalized to the mid level voltage by turning devices 68 and 62 on. Note that signal line 54 is common to the whole array, and its capacitance is much smaller than the total reference-cell storage capacitance, thus the reference-cell capacitors 64 and 72 are equalized to a voltage level substantially midway between the high and low levels stored in a cell capacitor. After equalization, devices 68 and 62 are turned off.

Before activation of a new RAS cycle, the bitline equalization devices, 18, 20 and 22 are turned off by forcing the signal on line 25 low. A wordline, such as 14, is selected and the corresponding reference wordline 44, is also selected and both are pulled low. After signal development on the bitline pair and the internal nodes 33 and 35 of the sense amplifier, the isolator devices 34 and 36 are turned off by pulling leads 38 and 40 low, isolating the sense amplifier 16, comprising devices 74, 76 and 78 and 80, from the bitline pair.

The sense amplifier 16 is set by the clock signals on leads 24 and 26 which are generated by the sense amplifier set clock 30 shown in FIG. 2 in a conventional manner. I/O activities are carried out through the bit switch device pair 79 and 81 after the setting of sense amplifier 16. After setting of the sense amplifier 16, only the bitline with the accessed cell, bitline 12 in this case, is moved high or low depending on the data by turning on device 36 with the high level on lead 40. This results in the voltage level stored in the cell capacitance 88 being set in accordance with the voltage on sense amplifier node 35. After setting the voltage level to the cell capacitor 88, the wordline 14 and the reference wordline 44 are pulled high, turning the access transistors of the accessed cell and reference cell off. The signals on leads 24 and 26 are then restored to the inactive state after returning the trigger signal on lead 28 to clock 30 to the low level by connecting lines 24 and 26 through devices not shown which short both the lines to $V_{eq}$. The remaining isolator device 34 and the bitline equalization devices 18, 20, and 22 are turned on and generate a new bitline precharge voltage.

Figure 5:
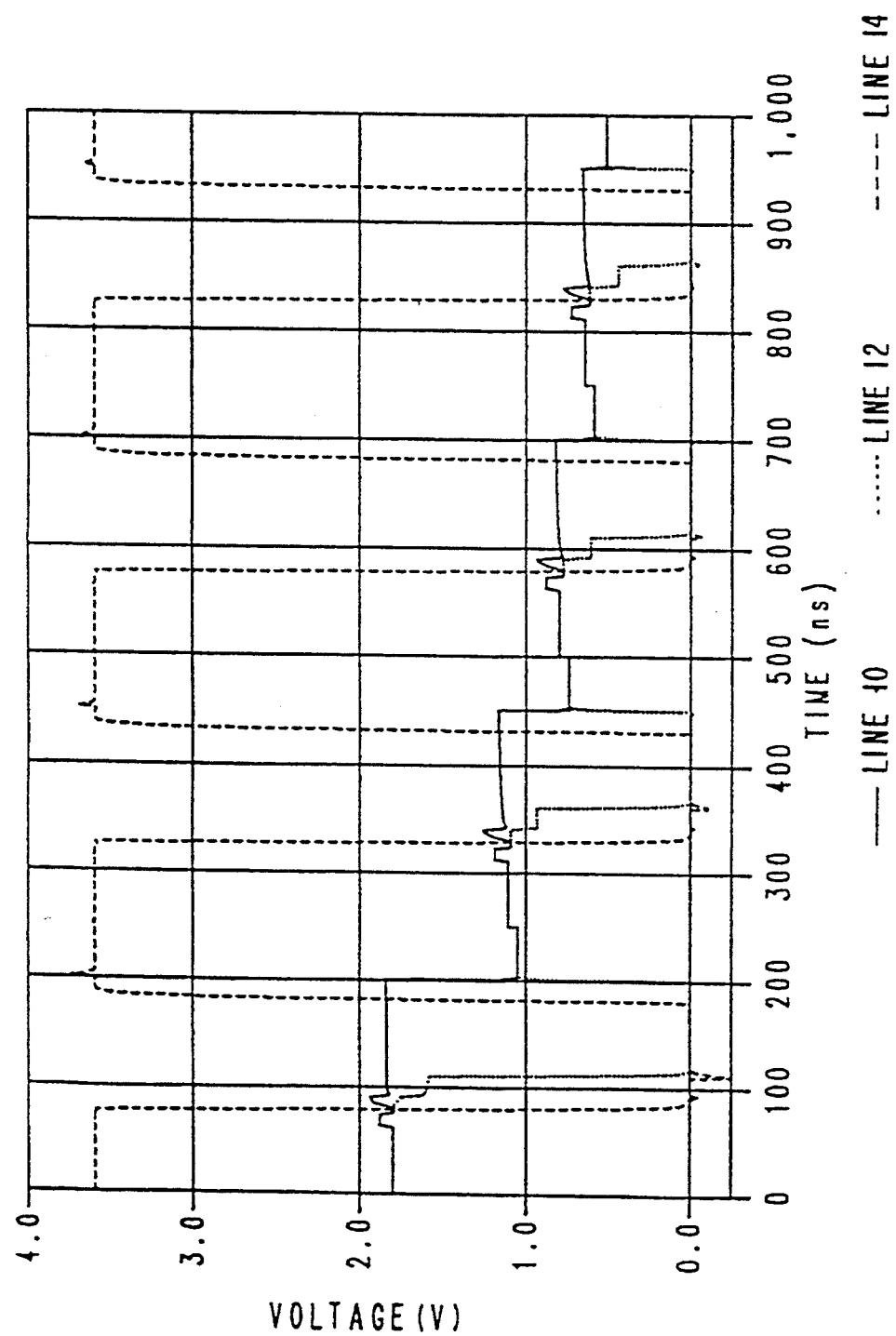
Figure 6:
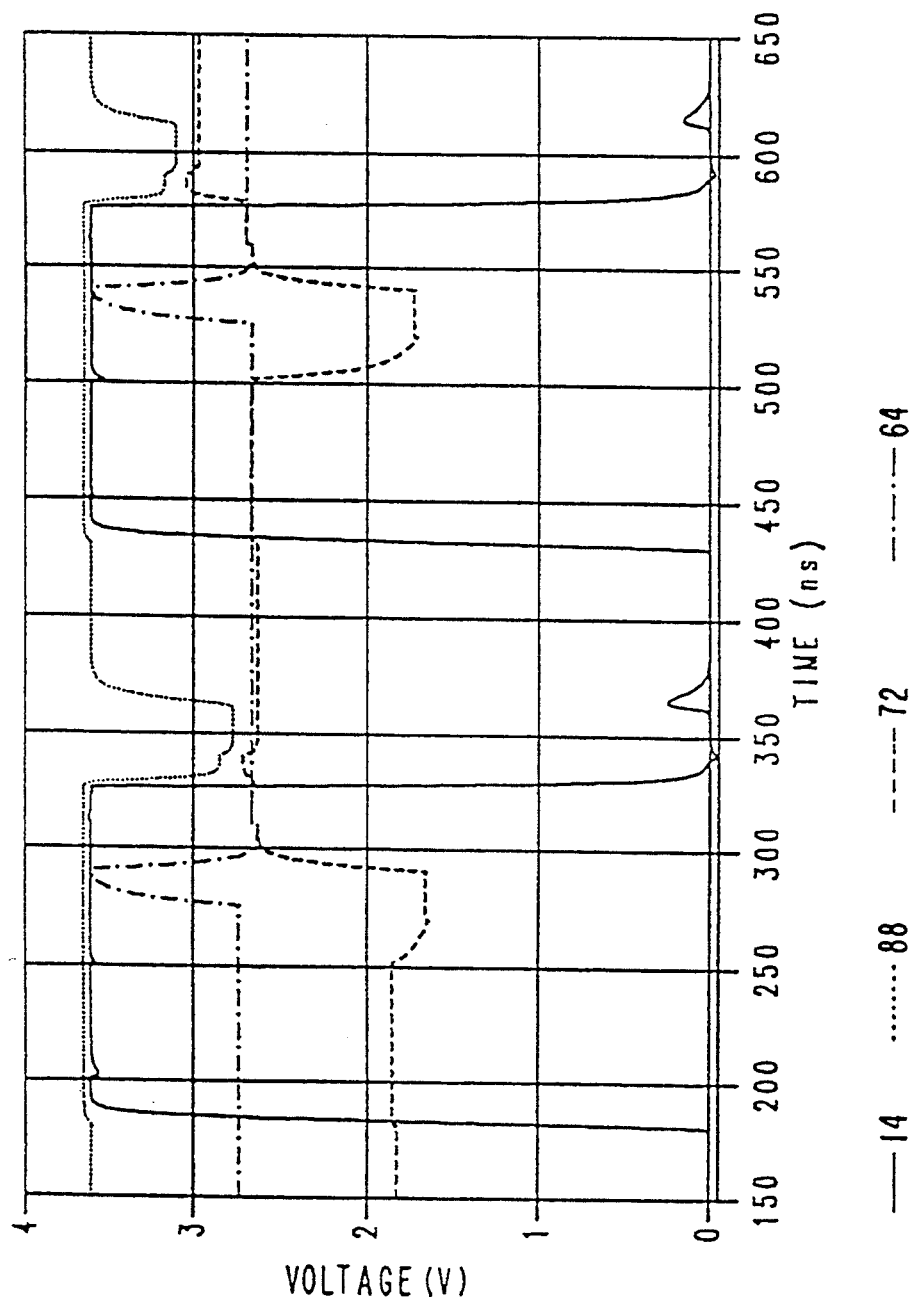
FIG. 6 is an illustration of the node waveforms of the capacitors of the cells and reference cells of FIG. 1 during circuit operation.

FIG. 4 shows the bitline waveforms for three-consecutive reading "1" and FIG. 5 shows the bitline waveforms for three-consecutive reading "0". FIG. 6 shows the node waveforms of the capacitors of the cell and reference cells during reading "1".

While there has been described and illustrated a preferred embodiment of the present invention, it will be apparent to those skilled in the art that modifications and variations are possible without deviating from the broad teachings and spirit of the invention which shall be limited solely by the scope of the claims appended hereto.

What is claimed is:

1. A DRAM structure using a variable precharge voltage sensing technique comprising:
   a memory cell including a first bitline;
   a reference cell including a second bitline, said first bitline and said second bitline forming a pair of bitlines;
   means for precharging said reference cell to a fixed predetermined voltage;
   means for setting said pair of bitlines to a precharge voltage and for varying said precharge voltage depending upon the level of sensed data in said memory cell during a previous RAS cycle; and
   sensing amplifier means coupled to said pair of bitlines for sensing relative levels of signals on said pair of bitlines.

2. A DRAM structure as set forth in claim 1, wherein said predetermined voltage is approximately $V_{DD}/2$.

3. A DRAM structure as set forth in claim 1, wherein said means for setting and varying said precharge voltage includes means for isolating said sensing amplifier means from said pair of bitlines and means for shorting said pair of bitlines together.

4. An array of DRAM cells using a variable precharge voltage sensing technique comprising:
   an array of memory cells, comprising pluralities of memory cells, each plurality of memory cells having an associated bitline;
   an array of reference cells, each reference cell being associated with a respective plurality of memory cells, a bitline associated with a first plurality of memory cells and a bitline associated with a second plurality of memory cells forming an associated pair of bitlines;
   means for precharging each reference cell in said array to a fixed predetermined voltage;
   means for setting each of said pair of bitlines to a precharge voltage and for varying said precharge voltage depending upon a level of sensed date in the associated pluralities of memory cells during a previous RAS cycle; and
   an array of sensing amplifier means, each sensing amplifier coupled to an associated pair of bitlines, for sensing relative levels of the signals on each associated pair of bitlines.

5. An array of DRAM cells as set forth in claim 4, wherein said predetermined voltage is approximately $V_{pp}/2$.

6. An array of DRAM cells as set forth in claim 4, wherein said means for setting and varying includes means for isolating each sensing amplifier means in said array of sensing amplifier means from the associated pair of bitlines and means for shorting together a plurality of pairs of bitlines.

7. An array of DRAM cells as set forth in claim 4, wherein said means for setting and varying includes means for isolating each sensing amplifier means in said array of sensing amplifier means from the associated pair of bitlines and means for shorting together all pairs of bitlines.

8. A method of sensing a DRAM cell including a first bitline and a reference cell including a second bitline, the first bitline and the second bitline forming a pair of bitlines, using a variable precharge voltage sensing technique comprising the steps of:

precharging said reference cell to a predetermined voltage;

setting said pair of bitlines to a precharge voltage;

varying said precharge voltage depending upon a level of sensed data in said cell during a previous RAS cycle; and sensing relative levels of signals on said pair of bitlines.

9. A method of sensing in a DRAM cell as set forth in claim 8, wherein said predetermined voltage is approximately $V_{DD}/2$.

10. A method of sensing in a DRAM cell as set forth in claim 8, wherein said varying comprises shorting said pair of bitlines together.

11. A method of sensing in an array of DRAM cells, the array including pluralities of memory cells, each plurality of memory cells having an associated bitline, and an array of reference cells, each reference cell being associated with a respective one of said plurality of memory cells, the bitline associated with a first plurality of memory cells and the bitline associated with a second plurality of memory cells forming an associated pair of bitlines, using a variable precharge voltage sensing technique, comprising the steps of:

precharging each reference cell in said array of reference cells to a predetermined voltage;

setting each associated pair of bitlines in said array to a precharge voltage;

varying said precharge voltage of each associated pair of bitlines depending upon a level of sensed date in the associated pluralities of memory cells during a previous RAS cycle; and sending relative levels of signals on each pair of bitlines.

12. A method of sensing in an array of DRAM cells as set forth in claim 11, wherein said predetermined voltage is approximately $V_{DD}/2$.

13. A method of sensing in an array of DRAM cells as set forth in claim 11, wherein said varying comprises shorting together a plurality of pairs of bitlines.

14. A method of sensing in an array of DRAM cells as set forth in claim 11, wherein said varying comprises shorting all pairs of bitlines together.

15. A DRAM structure as set forth in claim 1, wherein the precharge voltage set on the bitlines depends on a sequence of data bits previously sensed on the pair of bitlines.

16. An array of DRAM cells as set forth in claim 4, wherein the precharge voltage set on each pair of bitlines depends on a sequence of data bits previously sensed on that pair of bitlines.

17. A method of sensing in a DRAM cell as set forth in claim 8, wherein the precharge voltage depends on a sequence of data bits previously sensed on the pair of bitlines.

18. A method of sensing in an array of DRAM cells as set forth in claim 11, wherein the precharge voltage set on each pair of bitlines depends on a sequence of data bits previously sensed on that pair of bitlines.

* * * * *